(12) United States Patent
Paykarimah

(10) Patent No.: US 9,655,269 B2
(45) Date of Patent: May 16, 2017

(54) SUPPORT SYSTEM FOR PRINTED BOARD ASSEMBLIES

(71) Applicant: HONEYWELL INTERNATIONAL INC., Morristown, NJ (US)

(72) Inventor: Dariush Y. Paykarimah, North York (CA)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 136 days.

(21) Appl. No.: 14/709,842

(22) Filed: May 12, 2015

(65) Prior Publication Data
US 2016/0338215 A1    Nov. 17, 2016

(51) Int. Cl.
H05K 7/14    (2006.01)
H05K 7/20    (2006.01)

(52) U.S. Cl.
CPC ......... *H05K 7/1418* (2013.01); *H05K 7/1404* (2013.01); *H05K 7/1427* (2013.01); *H05K 7/20436* (2013.01)

(58) Field of Classification Search
None
See application file for complete search history.

(56) References Cited

U.S. PATENT DOCUMENTS

| | | | |
|---|---|---|---|
| 3,845,359 A | 10/1974 | Fedele | |
| 4,354,770 A * | 10/1982 | Block | F16B 2/14 254/104 |
| 4,480,287 A * | 10/1984 | Jensen | H05K 7/1404 361/707 |
| 4,823,951 A | 4/1989 | Colomina | |
| 5,071,013 A | 12/1991 | Peterson | |
| 5,220,485 A | 6/1993 | Chakrabarti | |
| 5,224,016 A * | 6/1993 | Weisman | H05K 7/1409 165/80.1 |
| 5,262,587 A * | 11/1993 | Moser | H05K 7/1404 174/15.1 |
| 5,382,175 A * | 1/1995 | Kunkel | H05K 7/1404 29/525.09 |
| 5,407,297 A * | 4/1995 | Hulme | H05K 7/1404 403/24 |
| 5,472,353 A * | 12/1995 | Hristake | H05K 7/1404 361/709 |
| 5,483,420 A * | 1/1996 | Schiavini | H05K 7/1404 211/41.17 |
| 5,485,353 A | 1/1996 | Hayes et al. | |
| 5,607,273 A * | 3/1997 | Kecmer | H05K 7/1404 411/24 |
| 5,859,764 A * | 1/1999 | Davis | H05K 7/20545 165/80.3 |
| 6,007,358 A | 12/1999 | Nagase | |

(Continued)

*Primary Examiner* — Xanthia C Cunningham
(74) *Attorney, Agent, or Firm* — Shimokaji IP

(57) ABSTRACT

Apparatus for guiding insertion and locking of a printed board assembly (PBA) in an electronic unit may include a housing, a first wedge segment having a sloped planar contact surface and a second wedge segment adjacent the first wedge segment and having a sloped planar contact surface. The first and second wedge segments may be devoid of holes in their respective sloped planar contact surfaces. The wedge segments may be supported in the housing so that the sloped contact surface of the first wedge segment is adjacent the sloped contact surface of the second wedge segment.

17 Claims, 13 Drawing Sheets

(56) References Cited

U.S. PATENT DOCUMENTS

| | | | | |
|---|---|---|---|---|
| 6,285,564 B1* | 9/2001 | O'Brien | ............... | H05K 7/1404 |
| | | | | 361/759 |
| 7,322,843 B1* | 1/2008 | Lee | ........................ | H01R 12/88 |
| | | | | 439/327 |
| 7,349,221 B2* | 3/2008 | Yurko | .................. | H05K 7/1404 |
| | | | | 165/80.2 |
| 7,477,524 B2 | 1/2009 | Way | | |
| 7,483,271 B2 | 1/2009 | Miller et al. | | |
| 7,505,251 B2 | 3/2009 | Canfield et al. | | |
| 8,045,332 B2* | 10/2011 | Lee | ...................... | H05K 7/1404 |
| | | | | 361/756 |
| 8,456,846 B2* | 6/2013 | Mosier | ...................... | F16B 2/14 |
| | | | | 361/728 |
| 8,559,178 B2* | 10/2013 | Monson | ............... | H05K 7/1404 |
| | | | | 361/700 |
| 8,616,559 B2 | 12/2013 | Marshall | | |
| 8,743,544 B2* | 6/2014 | Monson | ............... | H05K 7/1404 |
| | | | | 361/704 |
| 8,967,903 B1* | 3/2015 | Sharfi | ..................... | F16B 12/40 |
| | | | | 403/374.4 |
| 9,167,714 B2* | 10/2015 | Paquette | ............. | H05K 7/1404 |
| 2003/0048618 A1* | 3/2003 | Adams, Sr. | .......... | H05K 7/1442 |
| | | | | 361/740 |
| 2013/0309007 A1 | 11/2013 | Pawlowski et al. | | |

* cited by examiner

SUPPORT SYSTEM FOR PRINTED BOARD ASSEMBLIES

BACKGROUND OF THE INVENTION

The present invention generally relates to supporting and securing printed board assemblies (PBA's) in electronic units. More particularly, the invention relates to supporting and securing the PBAs so that excess heat generated during operation of the PBAs may be effectively transferred away from the PBAs.

A typical electronic unit may include multiple PBAs positioned in an air-cooled enclosure. Connector jacks may be positioned at one end of the enclosure. A series of parallel elongated card guides may be positioned on an inside surface of the enclosure with each card guide being substantially aligned with one of the connector jacks. Upon assembly of one of the electronic units, a PBA may be slid into one of the card guides so that pin-connectors of the PBA are inserted into the connector jacks. Each of the PBAs may have one hundred or more pin-connectors. Therefore accurate alignment of the pin-connectors and the corresponding connector jacks must be attained so that the pin-connectors are not damaged during assembly of the electronic units.

A longitudinal locking device or retainer may be positioned between the PBA and its corresponding card guide. The retainer may be left in an unlocked condition during insertion of the PBA into the card guide. After the PBA is connected to the connector jack, the retainer may be locked so that it forces a portion of the PBA against a wall of the card guide. Thus, the retainer effectively prevents undesired movement of the PBA in the electronic unit. Additionally, because the retainer produces a clamping force between the PBA and card guide, a limited pathway for heat transfer from the PBA to the card guide may develop.

In many evolving application of electronic units, for example electronic units employed in modern aircraft and aerospace vehicle, there are conflicting design goals. On the one hand, there is a goal of building electronic units with higher power ratings. On the other hand, there is a goal of building electronic units with an overall smaller size and weight. These design goals translate into designs of electronic units with closely spaced PBAs and a need to transfer high amounts of excessive heat from the closely spaced PB When PBAs are closely spaced, the card guides are narrow and the corresponding retainers are small. However, even though a retainer may be small, there is still a need that it remains effective in facilitating heat transfer from the PBA.

Additionally, electronic units with tightly spaced PBAs may be prone to pin damage during insertion of the PBAs unless very accurate alignment of the pin-connector and connectors jacks is maintained during insertion.

As can be seen, there is a need for a system of supporting and securing PBAs that provides effective heat transfer from closely spaced PBAs, and accurate alignment of pin-connectors of the PBAs with connector jacks of the electronic unit during insertion of the PBAs into an electronic unit.

SUMMARY OF THE INVENTION

In one aspect of the present invention apparatus for guiding insertion and locking of a printed board assembly (PBA) in an electronic unit comprises: a housing; a first wedge segment having a sloped planar contact surface; and a second wedge segment adjacent the first wedge segment and having a sloped planar contact surface; wherein the first and second wedge segments are devoid of holes in their respective sloped planar contact surfaces; and wherein the wedge segments are supported in the housing so that the sloped contact surface of the first wedge segment is adjacent the sloped contact surface of the second wedge segment.

In another aspect of the present invention, apparatus for supporting, guiding insertion and locking of a PBA in an electronic unit comprises: an integral retainer housing and card guide member having a PBA-contact side wall; a first wedge segment; a second wedge segment; and a compression spring coupled to the housing and card guide member, wherein the compression spring is partially compressed to: bear against the first wedge segment; apply an initial spring-biased force to the first wedge segment in a direction parallel to a longitudinal axis of the apparatus, and apply an initial spring-biased force to the second wedge segment in a direction orthogonal to the axis; wherein a PBA-contact surface of the spring-biased second wedge segment is spaced apart from the PBA-contact wall by a distance smaller than a thickness of a heat transfer tab of the PBA.

In yet another aspect of the present invention a retainer for locking a printed board assembly (PBA) and transferring heat from the PBA into a card guide of an electronic unit, comprises: a first side plate; a second side plate; spacing sleeves interposed between the side plates; wedge segments supported between the side plates; and support pins engaged with the first and second side plates; wherein at least one of the spacing sleeves passes through at least one of the wedge segments; and wherein at least one of the support pins is inserted in one of the spacer sleeves.

These and other features, aspects and advantages of the present invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Various inventive features are described below that can each be used independently of one another or in combination with other features. However, any single inventive feature may not address any of the problems discussed above or may only address one of the problems discussed above. Further, one or more of the problems discussed above may not be fully addressed by any of the features described below.

The present invention generally provides a system of supporting and securing printed board assemblies (PBAs) in an electronic unit. The system may provide effective heat transfer from closely spaced PBAs and accurate alignment of pin-connectors of the PBAs with connector jacks of the electronic unit during insertion of the PBAs into the electronic unit. More particularly, the present invention may provide PBA retainers through which effective heat transfer may occur. Additionally, the PBA retainers may provide alignment guidance during insertion of the PBAs into the electronic unit.

Figure 1:
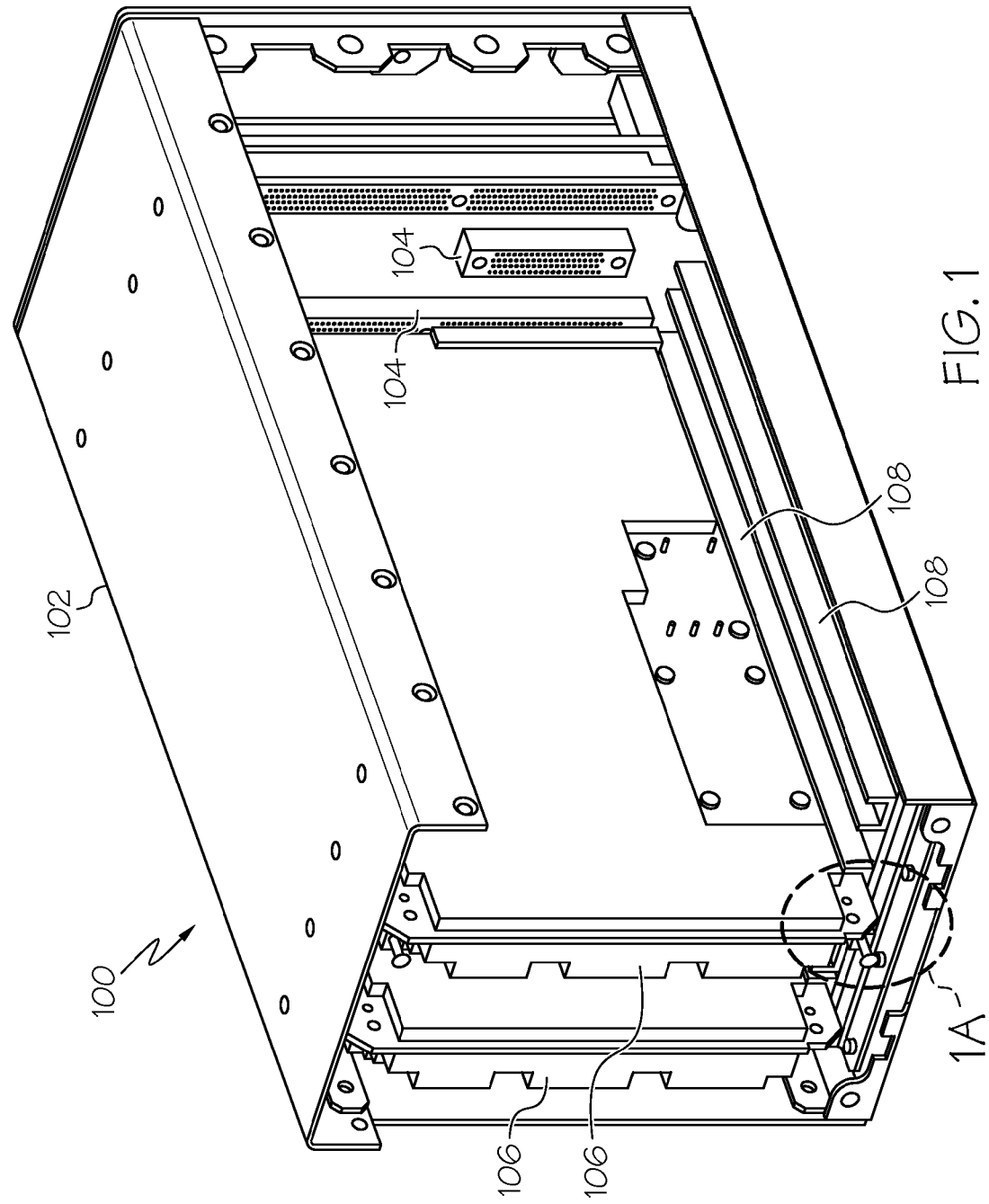
FIG. 1 is a perspective view of an electronic unit that includes apparatus for guiding insertion and locking of a printed board assembly (PBA) according to an exemplary embodiment of the present invention.
Figure 1A:
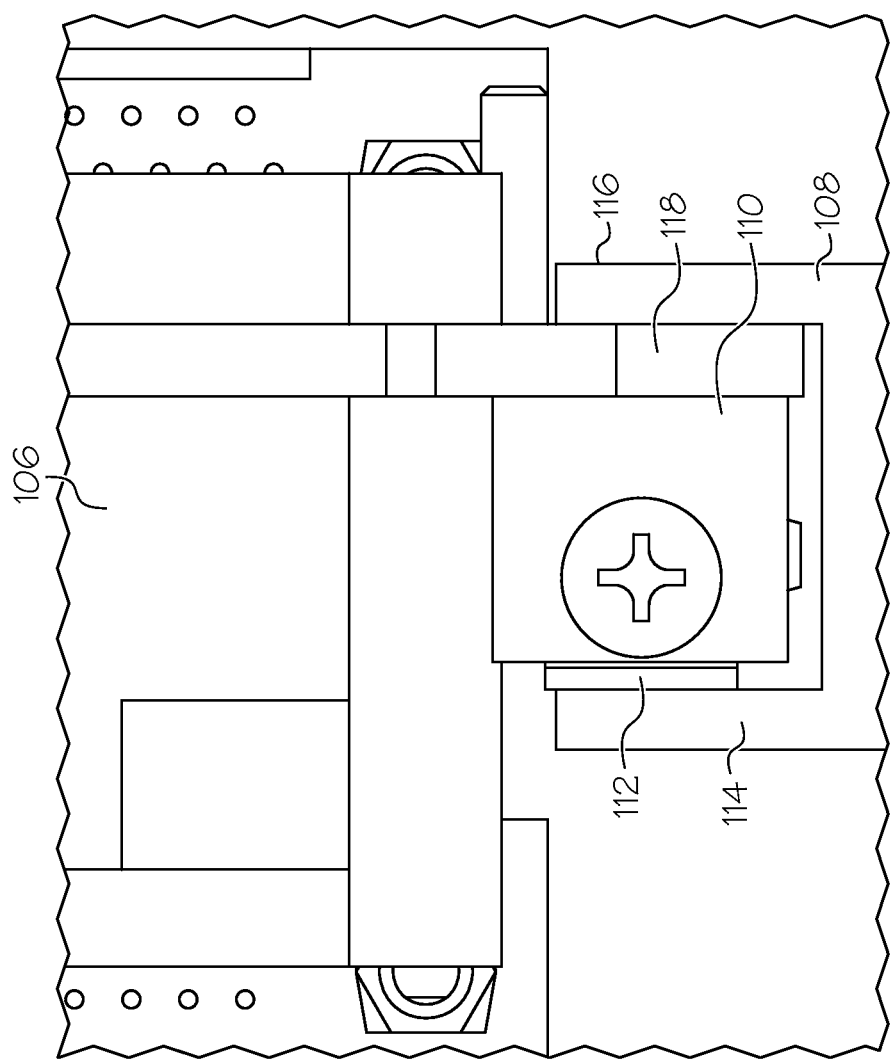
FIG. 1A is a detailed elevation view of a portion of the electronic unit of FIG. 1 showing the apparatus for guiding insertion and locking of a PBA in accordance with an exemplary embodiment of the invention.

Referring now to FIGS. 1 and 1A, an exemplary embodiment of an electronic unit 100 is illustrated in a partially assembled state. The electronic unit 100 may include an enclosure 102, connector jacks 104, printed board assemblies (PBAs) 106, card guides 108 and PBA retainers 110 (see FIG. 1A). Each of the PBAs 106 may have one of the retainers 110 attached to its respective heat transfer tab 118. FIG. 1A illustrates the PBA retainer 110 in a locked state in which laterally extendable wedge segments 112 may engage a wall 114 of the card guide 108. In this locked state, the PBA retainer 110 may apply force to the heat transfer tab 118 of the PBA 106 thereby forcing the tab 118 against a wall 116 of the card guide 108.

Figure 2:
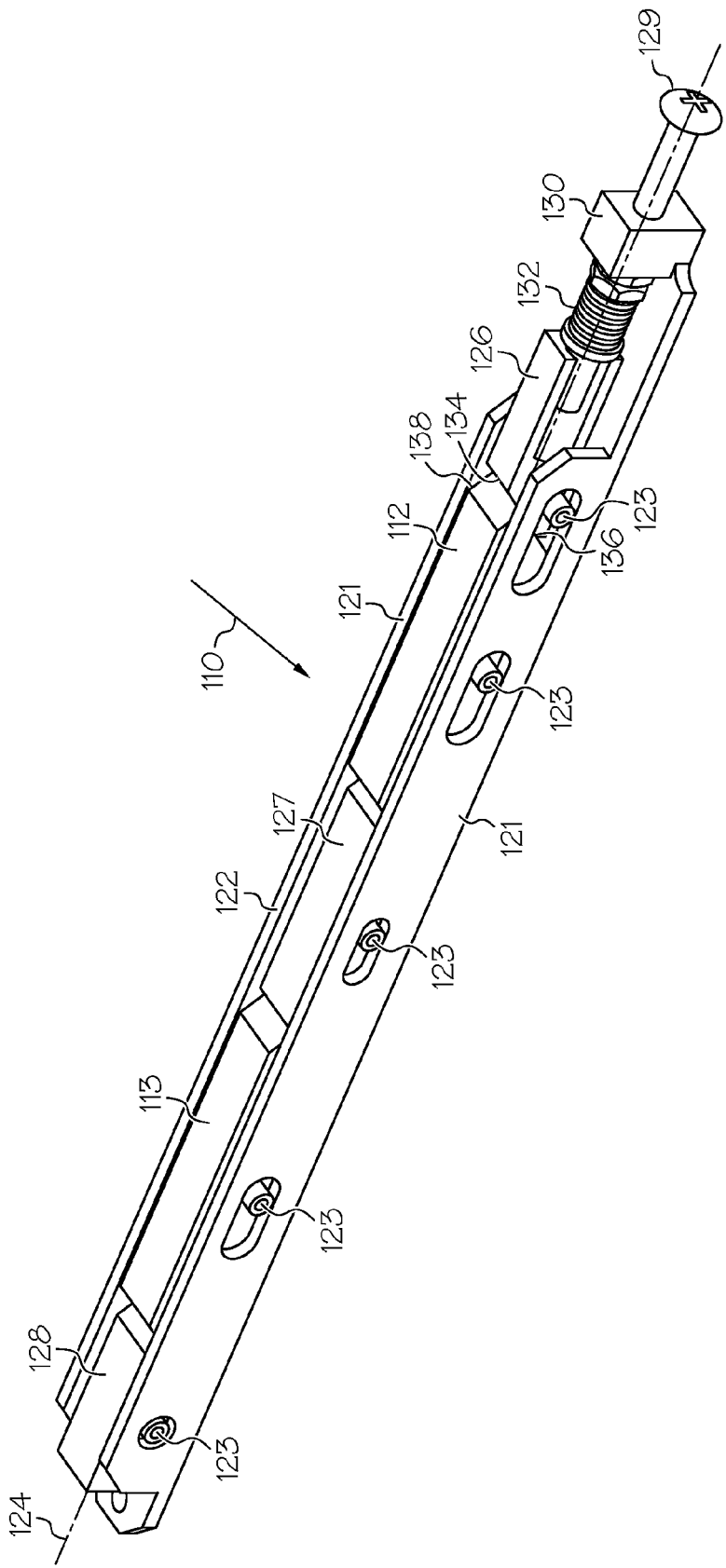
FIG. 2 is a perspective view of a PBA retainer in an unlocked state according to an exemplary embodiment of the present invention.
Figure 3:
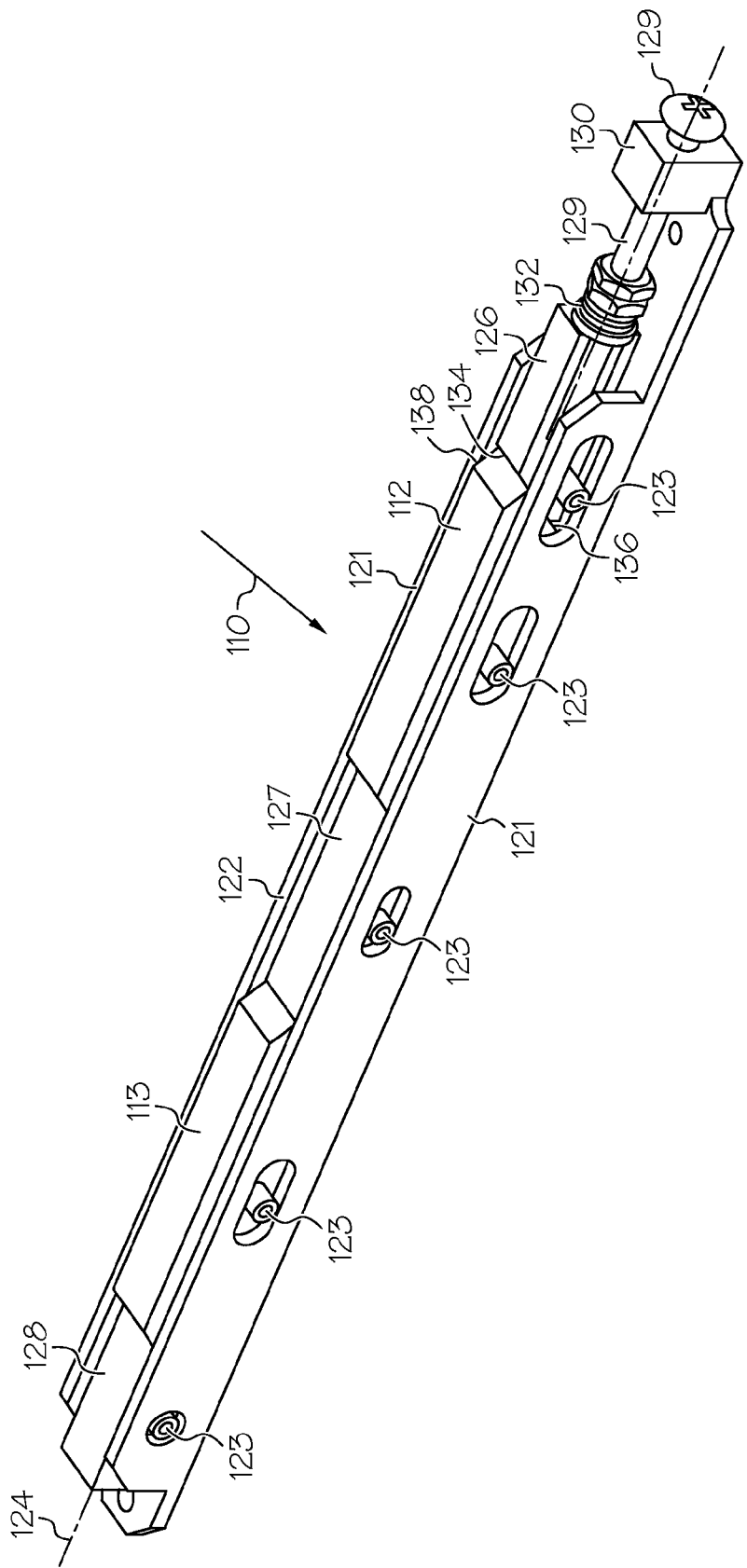
FIG. 3 is a perspective view of the PBA retainer of FIG. 2 in a locked state according to an exemplary embodiment of the present invention.

Referring now to FIGS. 2 and 3, an exemplary embodiment of one of the PBA retainers 110 is shown. In FIG. 2, the PBA retainer 110 is shown in an initially extended state. In FIG. 3, the PBA retainer is shown in a locked state. The PBA retainer 110 may include a housing 122 and a plurality of wedge segments held in place with pins 123. Wedge segments 126 and 127 may be configured to be longitudinally displaceable along an axis 124. A fixed wedge segment 128 may be secured within the housing 122 so that it is not free to move longitudinally. Laterally extendable wedge segments 112 and 113 may be configured to move both longitudinally and orthogonally relative to the axis 124.

A screw 129 may be threadably engaged with an extension 130 of the housing 122. A compression spring 132 may be interposed between the extension 130 and the wedge segment 126. Advancement of the screw 129 may compress the spring 132 so that the spring 132 may apply a longitudinal driving force to the wedge segment 126. As the wedge segment 126 is moved longitudinally, a sloping face 134 of the wedge segment 126 may press against an adjacent sloping face 136 of the laterally extendable wedge segment 112.

The sloping face 134 may have an angular orientation of about 45° relative to the axis 124. The sloping face 136 may have an angular orientation of equal magnitude as that of the face 134 but opposite in direction from the face 134. The wedge segment 126 may be constrained to preclude movement orthogonally relative to the axis 124. Thus, as the wedge segment 126 moves longitudinally, the sloping faces 134 and 136 may interact with one another to produce a combined longitudinal and lateral (i.e., orthogonal to the axis 124) displacement of the wedge segment 112.

Wedge segments 127 and 128 may be constrained to preclude movement orthogonally relative to the axis 124. Consequently, continued longitudinal movement of the wedge segment 126 may also result in longitudinal movement of the wedge segments 127. In a manner similar to that described above, interaction of the sloped contact surfaces 134 of the wedge segments 127 and 128 and the sloped contact surfaces 136 of the wedge segments 113 may result in a combined longitudinal and lateral displacement of the wedge segment 113.

Figure 4:
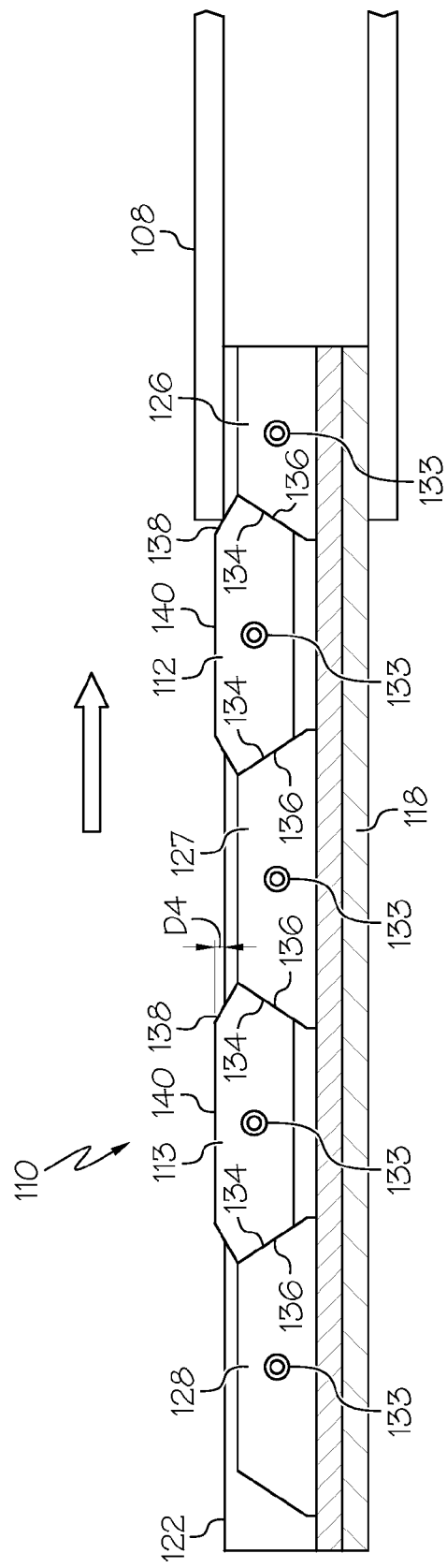
FIG. 4 is a schematic view of an operational feature of the PBA retainer of FIG. 2 according to an exemplary embodiment of the present invention.
Figure 5:
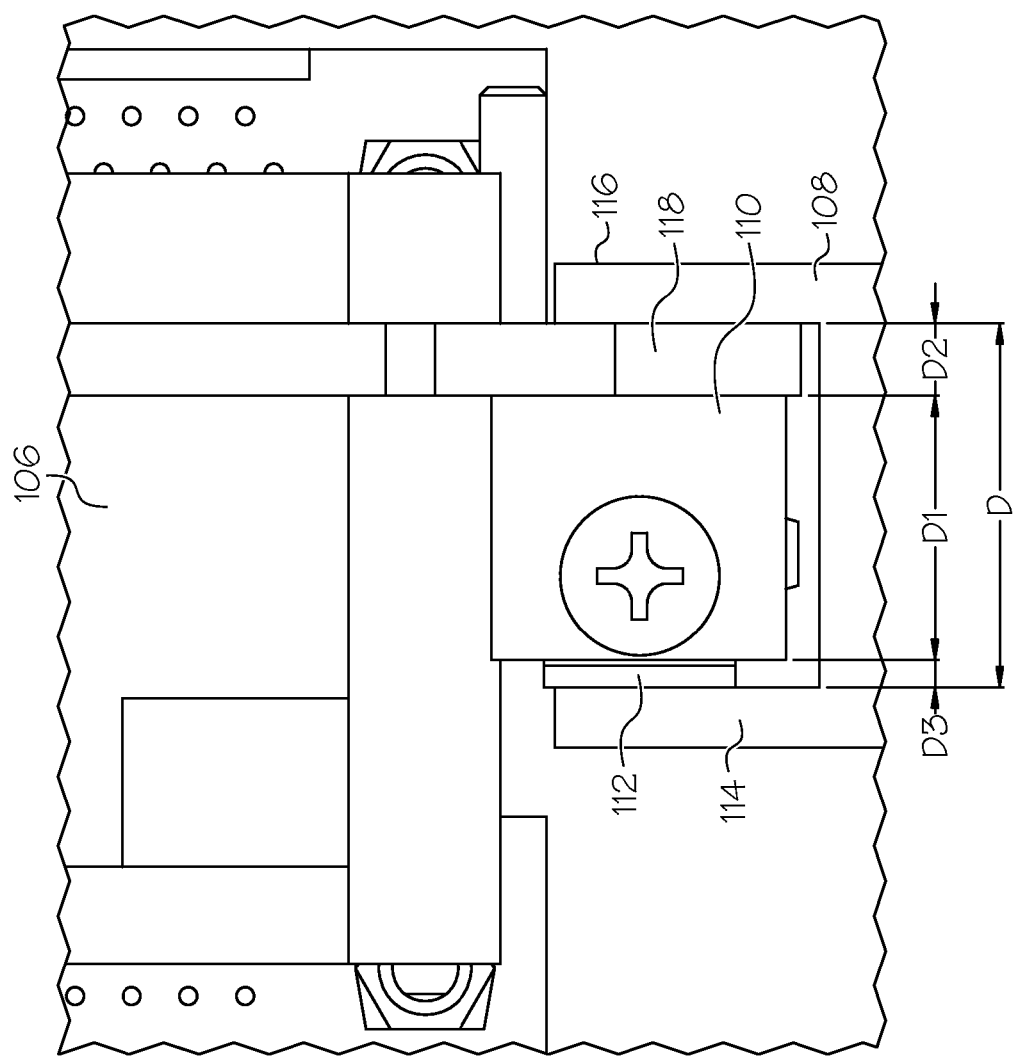
FIG. 5 is a second schematic view of the operational feature of FIG. 4 according to an exemplary embodiment of the present invention.

Referring further now to FIGS. 4 and 5, it may be seen that, in an exemplary embodiment of the retainer 110, the laterally displaceable segments 112 and 113 may be provided with leading edge chamfers 138 formed at junctions of top surfaces 140 of the wedge segments 112 and 113 with sloped contact surfaces 136 of the wedge segments 112 and 113. The retainer 110 may be constructed so that that compression spring 132 (see FIG. 3) is partially compressed even when the retainer 110 is in an unlocked state. With partial or initial spring force applied to the wedge segment 126, the wedge segments 112 and 113 may be laterally extended outwardly from the housing 122 with an initial lateral force. In other words, the wedge segments 112 and 113 may be in an initial spring-biased state with the compression spring 132 being compressed to about 70% to about 80% of its free length. This feature of the retainer 110 may be advantageously employed to provide alignment guidance for one of the PBAs 106 as the PBA is inserted into one of the card guides 108. During such insertion, a wall of the card guide 108 may press against the chamfers 138 of the wedge segments 112 and 113. The wedge segments 112 and 113 may be partially displaced back into the housing 122 as the tab 118 is pushed past the chamfers 138 and the wedge segments 112 and 113.

In their initial spring-biased state, the wedge segments 112 and 113 may extend outwardly the housing 122 by a distance D4 as shown in FIG. 4. The distance D4 may be larger than a distance D3 shown in FIG. 5. By referring to FIG. 5, it may be seen that the distance D3 may be equal to D−(D1+D2) where: D is an interior width of the card guide 108; D1 is a width of the housing 122; and D2 is a width of the heat transfer tab 118. Thus as the heat transfer tab 118 is inserted into the card guide 108, the spring-biased segments 112 and 113 may continually force the tab 118 against the wall 116 of the card guide 108. Consequently, the PBA 106 may be inserted with assurance that its pin connectors (not shown) will align correctly with a corresponding one of the connector jacks 104 (See FIG. 1).

Referring back to FIG. 3, the wedge segments of the retainer 106 are shown in a locked state. In the locked state, the screw 129 may be fully driven into the extension 130. The compression spring 132 may be compressed to about 20% to about 30% of its free length. The wedge segments 112 and 113 may be pressed against the heat transfer tab 118 with a spring-biased locking force. The spring-biased locking force may be substantially greater than the initial spring-biased force referred to above in connection with FIGS. 4 and 5. For example, the initial spring-biased force between the wedge segments 112 and 113 and the heat transfer tab 118 may be between about 0.5 pounds per square inch (psi) to about 0.7 psi whereas the locking spring-biased force may be as great as about 5 psi to about 7 psi.

It may be noted that, unlike prior art retainers which have wedge segments with longitudinal holes or other longitudinal openings, the retainer 110 may be constructed with metallic wedge segments that are substantially solid or monolithic except for openings 133 (See FIG. 4) for the pins 123. The wedge segments may have continuous rectangular cross-sections in any plane passing orthogonally to the axis 124, which plane does not pass through the opening 133. The sloped contact surfaces 134 and 136 may be shaped like such rectangular cross-sections in that the sloped contact surfaces 134 and 136 may be continuous, rectangular, planar surfaces. In other words, the sloped contact surfaces 134 and 136 may be devoid of surface interruptions such as holes or other absences of surface material.

Figure 6:
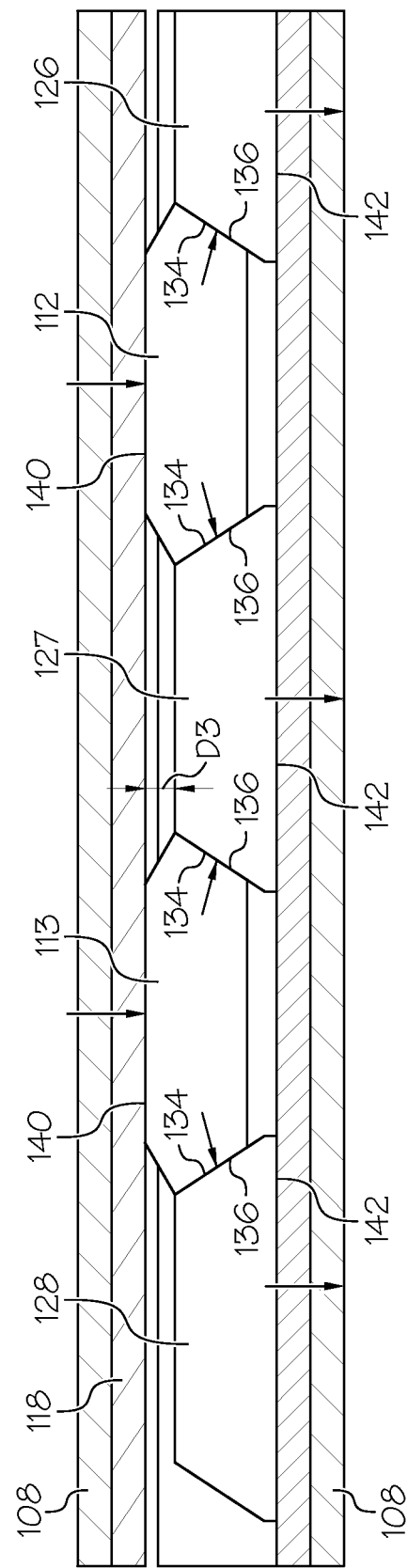
FIG. 6 is a schematic view of a second operational feature of the PBA retainer of FIG. 2 according to an exemplary embodiment of the present invention.

Thus, wedge segments of the retainer 110 may be particularly effective heat transfer agents. FIG. 6 illustrates heat transfer pathways through the retainer 110. Excess heat from one of the PBAs may pass from its heat transfer tab 118 into outer surfaces 140 of the wedge segments 112 and 113. The heat may then transfer across interfaces of surfaces 134 and 136. Heat may pass through inner surfaces 142 of the wedge segments 126, 127 and 128 into the housing 122. Heat transfer along these pathways may be enhanced because the wedge segment surfaces are flat and continuous. Additionally, heat transfer is enhanced by tight compression of the surfaces against one another with locking spring-biased forces of between 5 psi and 7 psi.

Figure 7:
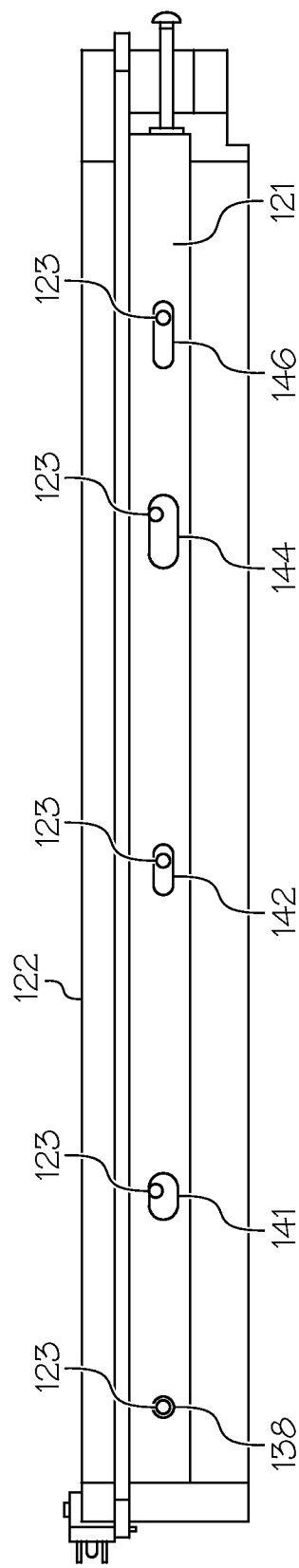
FIG. 7 is an elevational view of the PBA retainer of FIG. 3 according to an exemplary embodiment of the present invention.

Referring now to FIG. 7 and back to FIG. 2, it may be seen that walls 121 of the housing 122 may be provided with openings for the pins 123. The openings may vary in size and shape depending upon which of the wedge segments may be positioned adjacent the opening. For example, an opening 138 may be a simple hole in which one of the pins 123 for the fixed wedge segment 128 may be inserted. An opening 141 may be employed to engage with one of the pins 123 for the laterally extendable wedge segment 113. In that case, the opening 141 may be a slot with a longitudinal dimension greater than the diameter of the pin 123 and with a lateral dimension, orthogonal to the axis 124, greater than the diameter of the pin 123. Thus the opening 141 may accommodate both longitudinal and lateral movement of the wedge segment 113 as the wedge segment 113 is moved between its extended and withdrawn positions. Still another type of opening may be employed to preclude lateral movement of the wedge segment 127 while permitting longitudinal movement of the wedge segment 127. In that case, an opening 142 may have a longitudinal dimension greater than the diameter of the pin 123 of the wedge segment 127 but the lateral dimension of the opening 142 may be about the same as the diameter of the pin 123 of the wedge segment 127. An opening 144 may be used for the pin 123 of the laterally displaceable segment 112. The opening 144 may have a shape similar to that of the opening 141 but with a slightly larger longitudinal dimension to accommodate the condition that the wedge segment 112 moves further that the wedge segment 113 between its extended and withdrawn positions. An opening 146 for the pin 123 of the wedge segment 126 may have a shape similar to that of the opening 142 but with a slightly larger longitudinal dimension to accommodate the condition that the wedge segment 126 moves further that the wedge segment 127 between its extended and withdrawn positions.

Figure 8:
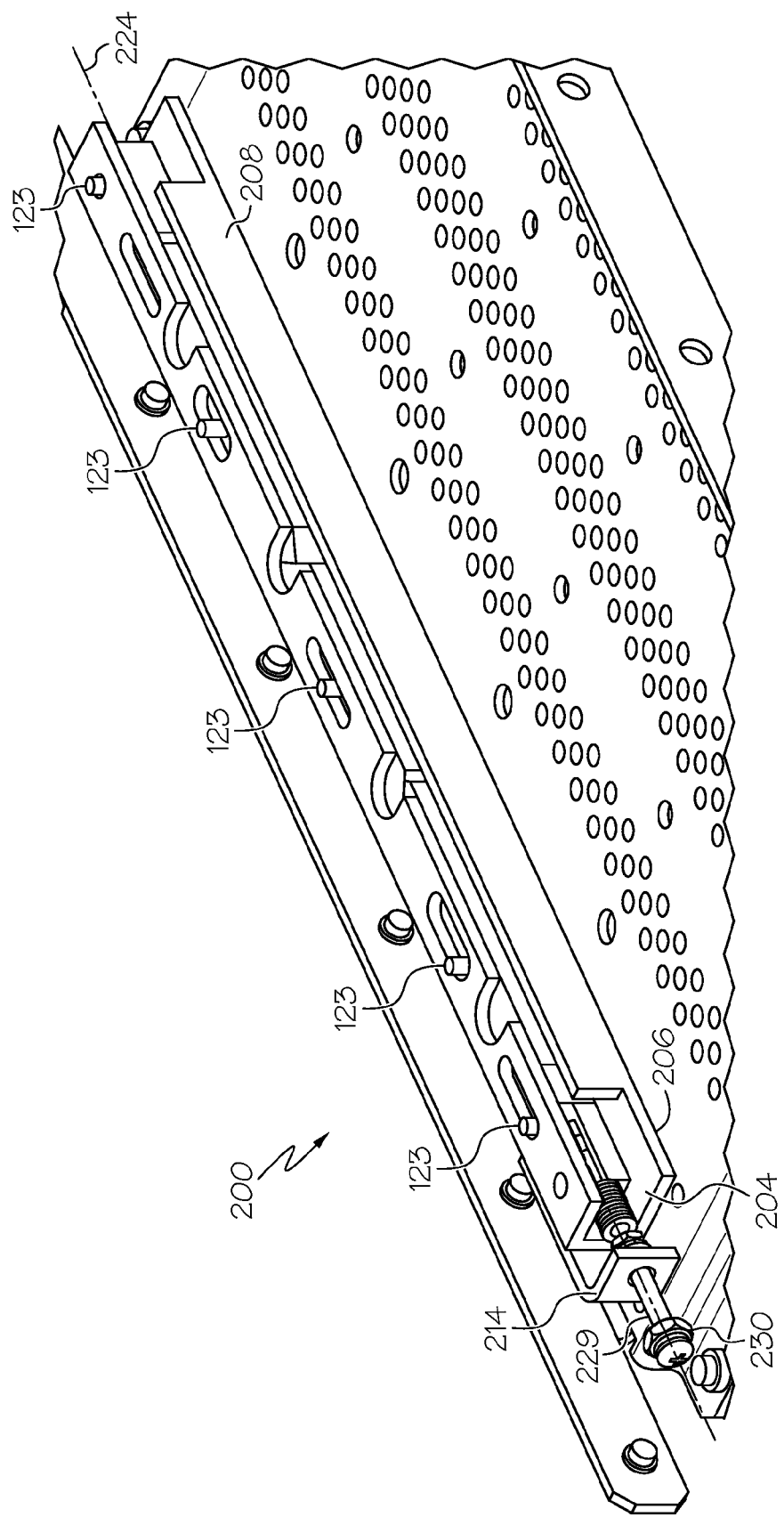
FIG. 8 is a perspective view of apparatus for guiding insertion and locking of a PBA according to a second exemplary embodiment of the present invention.
Figure 9:
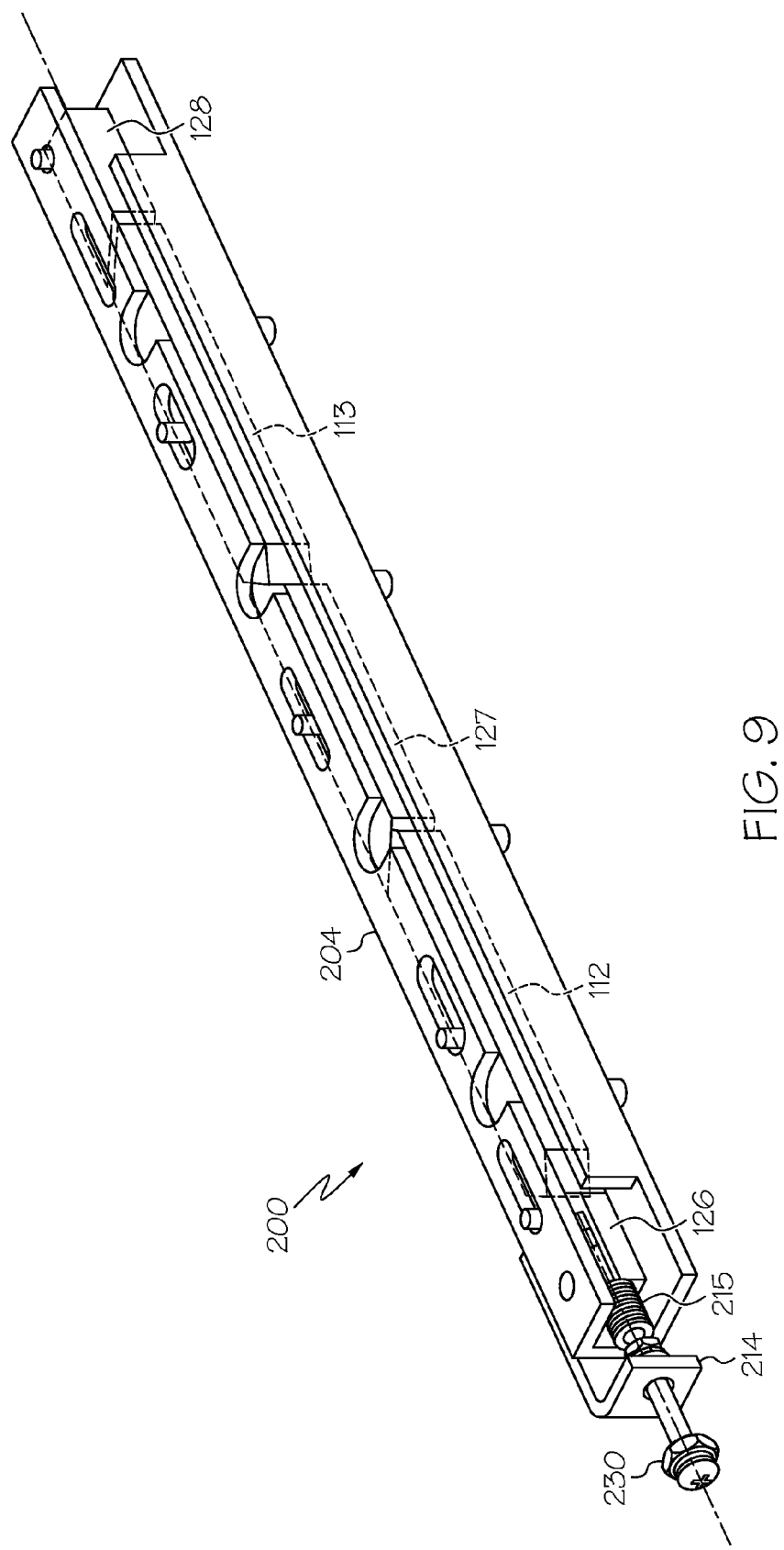
FIG. 9 is an perspective view of internal elements of the apparatus of FIG. 8 according to the second exemplary embodiment of the invention.

Referring now to FIGS. 8 and 9, there is illustrated an exemplary embodiment of card guide 200 with an integral retainer. The card guide 200 may differ from the retainer 110 and card guide 108 of FIGS. 1 and 1A in that the card guide 200 may be constructed as an integral sub-assembly that may be pre-installed in the enclosure 102 of the electronic unit 100 of FIG. 1. In that regard, the card guide 200 may provide for advantageous cost savings because there may be no need to attach one of the separate retainers 110 to each one of the PBAs 106 as described above in connection with FIG. 1A. The card guide 200 may include a housing and guide member 204 with a bottom 206, a PBA-contact wall 208. The card guide 200 may include wedge segments 112, 113, 126, 127 and 128 constructed in the same manner as those included in the retainer 110 of FIGS. 2 and 3. The wedge segments 112, 113, 126, 127, and 128 may be supported on an axis 224 with pins 123. A screw 229 and a locking nut 230 may be threadably engaged with a compression-spring bearing member 214. The extension member 214 may be constructed as an element that may be attached to the housing and guide member 204. By employing a separate compression-spring bearing member 214 attached to the housing and guide member 204, the housing and guide members 204 may be constructed from low cost linear metallic extrusions.

Figure 10:
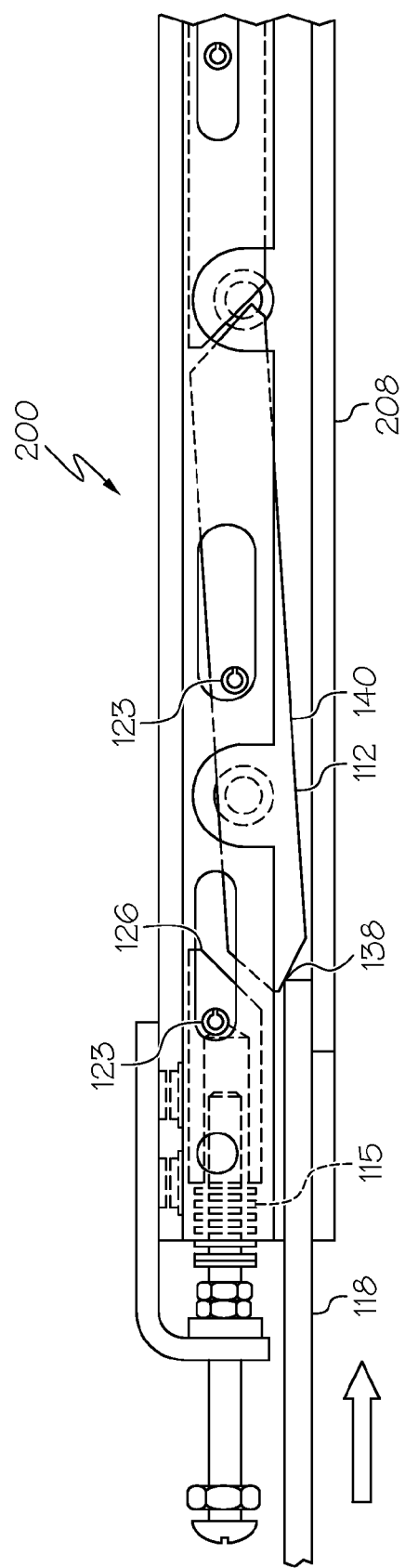
FIG. 10 is a schematic view of an operational feature of the PBA retainer of FIG. 8 according to an exemplary embodiment of the present invention.

As shown in FIG. 10, a compression spring 215 may be partially compressed to bear against the wedge segment 126 and to apply an initial spring-biased force to the wedge segment 126 in a direction parallel to the longitudinal axis 224 of the card guide 200. The compression spring 215 may also effectively apply an initial spring-biased lateral force to the wedge segment 112 in a direction orthogonal to the axis 224.

The top surface 140 or PBA contact surface of the spring-biased wedge segment 112 may be spaced apart from the PBA-contact wall 208 by a distance smaller than a thickness of a heat transfer tab 118 of the PBA 106 so that upon insertion of the PBA, the heat transfer tab 118 is pressed against the PBA-contact wall 208.

Figure 11:
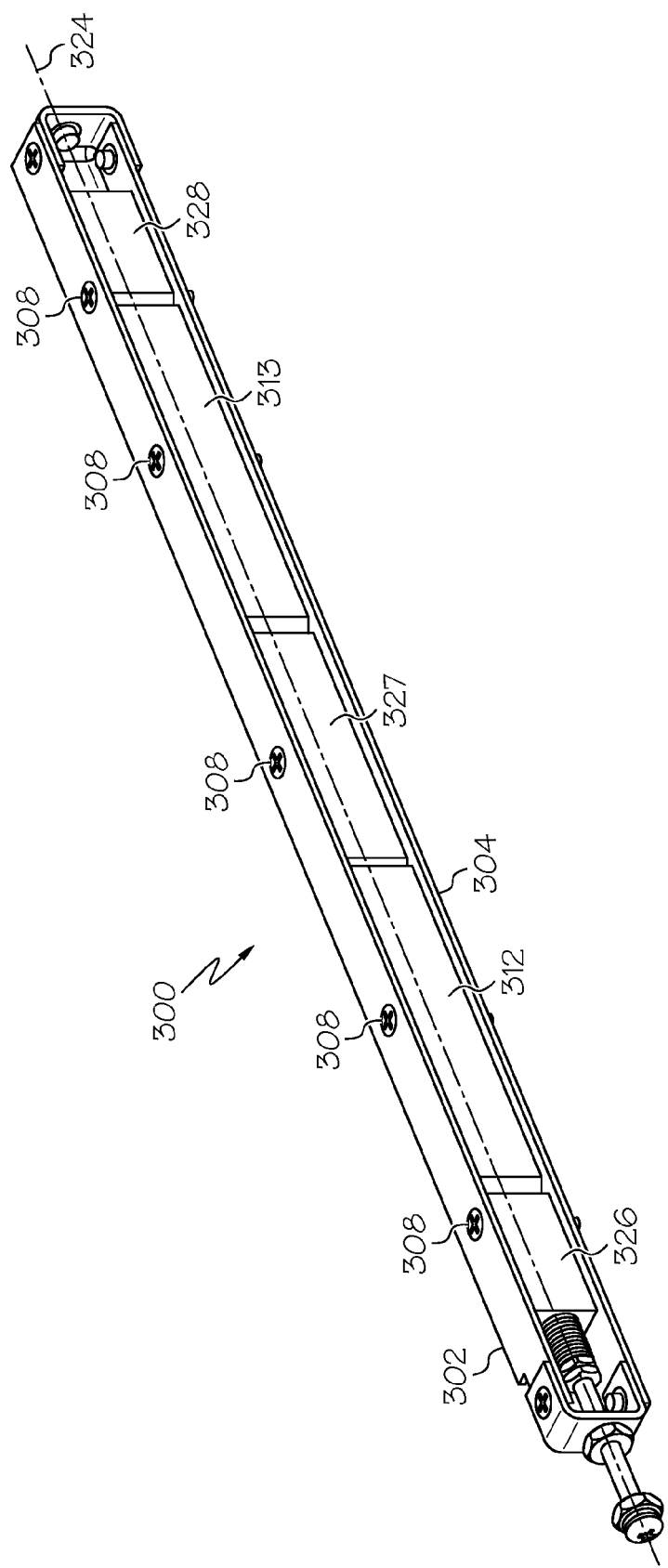
FIG. 11 is a perspective view of a PBA retainer according to a third exemplary embodiment of the invention.
Figure 12:
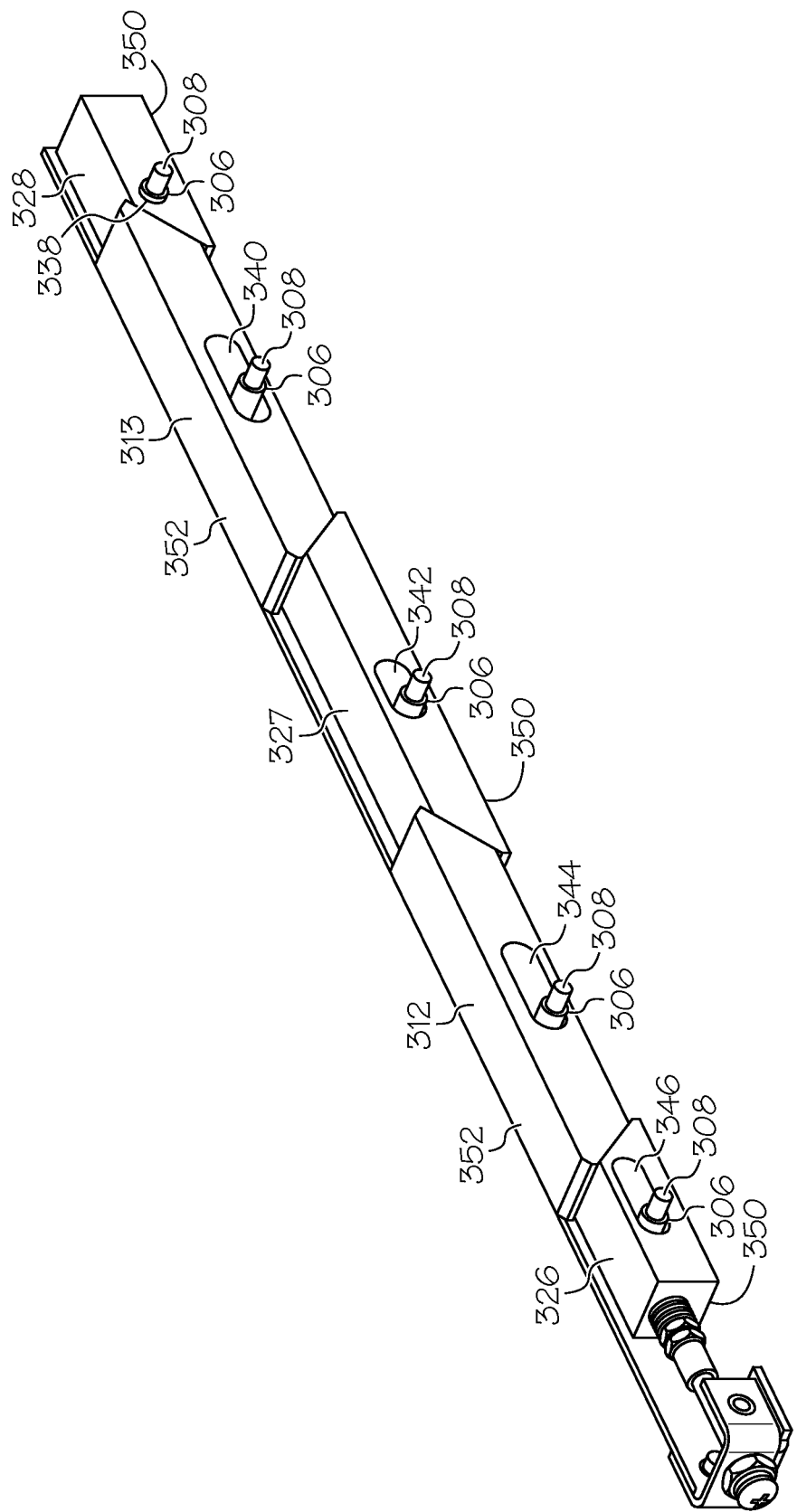
FIG. 12 is a perspective cut-away view of the PBA retainer of FIG. 11 according to the third exemplary embodiment of the invention.

Referring now to FIGS. 11 and 12, there is illustrated an exemplary embodiment of a retainer 300 which may be constructed with a low cost sheet metal housing. The card guide 300 may differ from the retainer 110 of FIG. 1A, 2 and 3 in that the card guide 300 may be constructed from low-cost materials whereas the retainer 110 may need to be constructed with a more expensive machined housing 122. The retainer 300 may include sheet metal side plates 302 and 304. The side plates 302 and 304 may be held in a desired spaced-apart relation to one another with a plurality of spacer sleeves 306. The spacer sleeves 306 may be supported on wedge-segment support pins 308.

Wedge segments 312, 313, 326, 327 and 328 may configured to act in a manner similar to the wedge segments 112, 113, 126, 127 and 128 of the retainer 110 of FIGS. 2 and 3. The wedge segments 312, 313, 326, 327 and 328 may be provided with openings similar in size and location as the openings in the walls 121 of the housing 122 of the retainer 110.

For example, an opening 338 may be a simple hole in which one of the spacer sleeves 306 for the fixed wedge segment 328 may be inserted. A slot 340 may be employed to engage with one of the spacer sleeves 306 for the laterally extendable segment 313. In that case, the slot 340 may have a longitudinal dimension greater than the diameter of the spacer sleeve 306 and a lateral dimension, orthogonal to an axis 324, greater than the diameter of the spacer sleeve 306. Thus the slot 340 may accommodate both longitudinal and lateral movement of the wedge segment 313 as the wedge segment 313 is moved between its extended and withdrawn positions. Still another type of opening may be employed to preclude lateral movement of the wedge segment 327 while permitting longitudinal movement of the wedge segment 327. In that case, a slot 342 may have a longitudinal dimension greater than the diameter of the spacer sleeve 306 of the wedge segment 327 but the lateral dimension of the slot 342 may be about the same as the diameter of the spacer sleeve of the wedge segment 327. A slot 344 may be used for the spacer sleeve 306 of the laterally displaceable segment 312. The slot 344 may have a shape similar to that of the slot 340 but with a slightly larger longitudinal dimension to accommodate the condition that the wedge segment 312 moves further that the wedge segment 313 between its extended and withdrawn positions. A slot 346 for the spacer sleeve 306 of the wedge segment 326 may have a shape similar to that of the slot 342 but with a slightly larger longitudinal dimension to accommodate the condition that the wedge segment 326 moves further that the wedge segment 327 between its extended and withdrawn positions.

It may be noted that the retainer 300 may not include a bottom plate. Thus, inner surfaces 350 or card-guide contact surfaces of the wedge segments 326, 327 and 328 may be exposed and may transfer heat directly to an underlying portion of one of the card guides to which the retainer 300 may be attached. Additionally, outer surfaces 352 of PBA-contact surfaces of the wedge segments 312 and 313 are exposed. Consequently, excess heat may be advantageously transferred away from a PBA without passing through a housing/card guide interface.

It should be understood, of course, that the foregoing relates to exemplary embodiments of the invention and that modifications may be made without departing from the spirit and scope of the invention as set forth in the following claims.

I claim:

1. Apparatus for guiding insertion and locking of a printed board assembly (PBA) in an electronic unit comprising:
   a housing;
   a first wedge segment having a sloped planar contact surface; and
   a second wedge segment adjacent the first wedge segment and having a sloped planar contact surface;
   wherein the first and second wedge segments are devoid of holes in their respective sloped planar contact surfaces;
   wherein the first and second wedge segments are supported in the housing so that the sloped contact surface of the first wedge segment is adjacent the sloped contact surface of the second wedge segment;
   a first pin inserted through the first wedge segment;
   a second pin inserted through the second wedge segment;
   wherein the first pin extends through a first opening in a wall of the housing;
   wherein the second pin extends through a second opening in the wall of the housing;
   wherein the first opening is a slot having a longitudinal dimension greater than a diameter of the first pin and having a lateral dimension, orthogonal to the axis of the housing, substantially equal to the diameter of the first pin; and
   wherein the second opening is a slot having a longitudinal dimension greater than a diameter of the second pin and having a lateral dimension, orthogonal to the axis of the housing, greater than the diameter of the first pin.

2. The apparatus of claim 1 further comprising:
   a third wedge segment having a sloped contact surface;
   wherein the second wedge segment has a second sloped contact surface;
   wherein the third wedge segment is fixedly supported in the housing; and
   wherein the sloped contact surface of the third wedge segment is adjacent the second sloped contact surface of the second wedge segment.

3. The apparatus of claim 1 further comprising a compression spring positioned to bear against a portion of the housing and the first wedge segment, said compression spring being compressed to apply: an initial force to the first wedge segment in a direction parallel to the longitudinal axis of the housing, and an initial lateral force to the second wedge segment in a direction orthogonal to the axis.

4. The apparatus of claim 3 wherein the initial forces are produced when the compression spring is compressed to about 80% to about 70% of its free length.

5. The apparatus of claim 3 further comprising:
   a card guide having spaced apart walls;
   wherein the second wedge segment has a top surface and a chamfer surface formed at a junction of the top surface and the first sloped contact surface of the second wedge segment;
   wherein the top surface of the second wedge segment extends laterally outwardly a distance (D4) beyond the housing when the initial force is produced by the compression spring; and
   wherein the distance D4 is greater than a distance (D3) and D3 is equal to D−(D1+D2) where: D is an interior width between the walls of the card guide; D1 is a width of the housing; and D2 is a width of a heat transfer tab of the PBA;
   whereby, upon insertion of the PBA into the card guide, the heat transfer tab is pressed against an interior surface of one of the walls of the card guide.

6. The apparatus of claim 3 further comprising a screw threadably engaged with the portion of the housing and coupled to the compression spring such that advancement of the screw in the portion of the housing results in further compression of the compression spring and in locking force being applied to the second wedge segment.

7. The apparatus of claim 6 wherein the locking force is produced when the compression spring is compressed to about 30% to about 20% of its free length.

8. Apparatus for supporting, guiding insertion and locking of a PBA in an electronic unit comprising:
   an integral retainer housing and card guide member having a PBA-contact side wall;
   a first wedge segment;
   a second wedge segment; and
   a compression spring coupled to the housing and card guide member,
   wherein the compression spring is partially compressed to:
      bear against the first wedge segment;

apply an initial spring-biased force to the first wedge segment in a direction parallel to a longitudinal axis of the apparatus and;

apply an initial spring-biased force to the second wedge segment in a direction orthogonal to the axis; and wherein a PBA contact surface of the spring-biased second wedge segment is spaced apart from the PBA-contact wall by a distance smaller than a thickness of a heat transfer tab of the PBA.

9. The apparatus of claim 8 further comprising:

a first pin inserted through the first wedge segment; and a second pin inserted through the second wedge segment;

wherein the first pin extends through a first opening in the housing and card guide member; and wherein the second pin extends through a second opening in the housing and card guide member.

10. The apparatus of claim 9:

wherein the first opening is a slot having a longitudinal dimension greater than a diameter of the first pin and having a lateral dimension, orthogonal to the axis of the housing, substantially equal to the diameter of the first pin; and wherein the second opening is a slot having a longitudinal dimension greater than a diameter of the second pin and having a lateral dimension, orthogonal to the axis of the housing, greater than the diameter of the first pin.

11. The apparatus of claim 10 wherein a bottom of the housing and card guide member is provided with openings that correspond in size and shape to the openings in the housing and card guide member.

12. The apparatus of claim 8 wherein the PBA-contact side wall and the bottom are integrally formed as a portion of a linear extrusion.

13. The apparatus of claim 12 further comprising a compression-spring bearing member attached to the portion of the linear extrusion, the compression spring positioned to bear against the compression-spring bearing member and the first wedge segment.

14. The apparatus of claim 13 further comprising a screw threadably engaged with the compression-spring bearing member and coupled to the compression spring such that advancement of the screw in the compression-spring bearing member results in a spring-biased locking force being applied to the second wedge segment.

15. A retainer for locking a printed board assembly (PBA) and transferring heat from the PBA into a card guide of an electronic unit, comprising:

a first side plate;

a second side plate;

spacing sleeves interposed between the side plates;

wedge segments supported between the side plates; and support pins engaged with the first and second side plates;

wherein at least one of the spacing sleeves passes through at least one of the wedge segments; and wherein at least one of the support pins is inserted in one of the spacer sleeves.

16. The apparatus of claim 15:

wherein the wedge segments have sloped contact surfaces, and wherein the sloped contact surfaces are continuous rectangular planar surfaces.

17. The apparatus of claim 15:

wherein the at least one wedge segment has a slot with a longitudinal dimension greater than a spacing-sleeve diameter and with a lateral dimension, orthogonal to the axis of the housing, substantially equal to the spacing-sleeve diameter; and wherein another one of the wedge segments has a slot with a longitudinal dimension greater than the spacing-sleeve diameter and with a lateral dimension, orthogonal to the axis of the apparatus, greater than the spacing-sleeve diameter.

* * * * *

UNITED STATES PATENT AND TRADEMARK OFFICE
CERTIFICATE OF CORRECTION

| | | |
|---|---|---|
| PATENT NO. | : 9,655,269 B2 | |
| APPLICATION NO. | : 14/709842 | |
| DATED | : May 16, 2017 | |
| INVENTOR(S) | : Dariush Paykarimah | |

It is certified that error appears in the above-identified patent and that said Letters Patent is hereby corrected as shown below:

On the Title Page

Item (72), the inventor's name on the Letters Patent has been corrected from 'Dariush Y. Paykarimah' to 'Dariush Paykarimah'

Signed and Sealed this
Eleventh Day of July, 2017

Joseph Matal
*Performing the Functions and Duties of the*
*Under Secretary of Commerce for Intellectual Property and*
*Director of the United States Patent and Trademark Office*